United States Patent
Watanabe et al.

(10) Patent No.: US 7,858,287 B2
(45) Date of Patent: Dec. 28, 2010

(54) PHOTOSENSITIVE RESIN, AND PHOTOSENSITIVE COMPOSITION

(75) Inventors: Takeo Watanabe, Hyogo (JP); Hiroo Kinoshita, Hyogo (JP); Shinichi Yusa, Hyogo (JP); Tomotaka Yamanaka, Chiba (JP); Masamichi Hayakawa, Chiba (JP); Yosuke Osawa, Chiba (JP); Satoshi Ogi, Chiba (JP); Yoshitaka Komuro, Kanagawa (JP)

(73) Assignees: Hyogo Prefecture, Hyogo (JP); Toyo Gosei Co., Ltd, Chiba (JP)

( * ) Notice: Subject to any disclaimer, the term of this patent is extended or adjusted under 35 U.S.C. 154(b) by 601 days.

(21) Appl. No.: 11/947,850
(22) Filed: Nov. 30, 2007

(65) Prior Publication Data
US 2009/0142697 A1 Jun. 4, 2009

(51) Int. Cl.
G03F 7/004 (2006.01)
G03F 7/028 (2006.01)
G03F 7/039 (2006.01)
G08F 12/30 (2006.01)

(52) U.S. Cl. .................... 430/270.1; 430/326; 430/905; 430/919; 430/920; 430/921; 430/922; 526/286; 526/288; 526/256; 526/257

(58) Field of Classification Search .............. 430/270.1, 430/326, 905, 907, 919, 920, 921, 922, 925; 526/256, 257, 286, 288, 346
See application file for complete search history.

(56) References Cited

U.S. PATENT DOCUMENTS 4,491,628 A   1/1985   Ito et al. ...................... 430/176
(Continued)

FOREIGN PATENT DOCUMENTS

JP   2005-084365   *   3/2005
JP   2008-062114   *   3/2008

Primary Examiner—Sin J. Lee
Assistant Examiner—Anca Eoff
(74) Attorney, Agent, or Firm—Young & Thompson

(57) ABSTRACT

A photosensitive resin realizes formation of a pattern having a good shape, without introducing poor compatibility between an acid generator and a photoresist primary-component polymer having an acid-dissociable group, and a photosensitive composition containing the photosensitive resin. The photosensitive resin includes a repeating unit represented by formula (1):

(1)

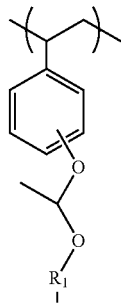

-continued

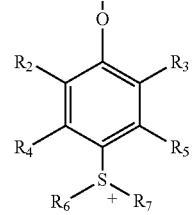

(wherein $R_1$ represents a C2-C9 linear or branched divalent hydrocarbon group; each of $R_2$ to $R_5$ represents a hydrogen atom or a C1-C3 linear or branched hydrocarbon group; each of $R_6$ and $R_7$ represents an organic group, wherein $R_6$ and $R_7$ may together form a divalent organic group; and $X^-$ represents an anion);

at least one of a repeating unit represented by formula (2):

(2)

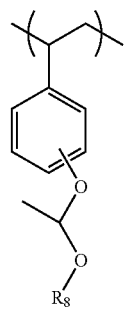

(wherein $R_8$ represents a C2-C9 linear or branched hydrocarbon group) and a repeating unit represented by formula (3):

(3)

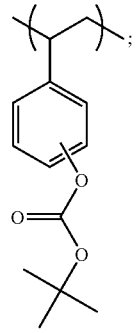

a repeating unit represented by formula (4):

(4)

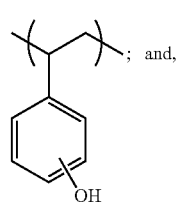

; and, optionally, a repeating unit represented by formula (5).

(5)

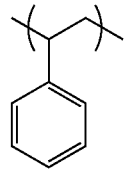

7 Claims, No Drawings

U.S. PATENT DOCUMENTS 5,130,392 A * 7/1992 Schwalm et al. ............ 526/288
7,514,204 B2 * 4/2009 Hatakeyama et al. .... 430/270.1
2002/0182541 A1 * 12/2002 Gonsalves ............... 430/287.1
2007/0219368 A1 9/2007 Iwabuchi et al. ............... 544/5

* cited by examiner

PHOTOSENSITIVE RESIN, AND PHOTOSENSITIVE COMPOSITION

BACKGROUND OF THE INVENTION

1. Field of the Invention

The present invention relates to a photosensitive resin which includes, in the structure thereof, a moiety that readily generates an acid through irradiation with active radiation (e.g., deep UV rays, electron beams, X-rays, or EUVs (extreme ultraviolet rays) and an acid-dissociable group, and which is useful as a chemically amplified photoresist material; and to a photosensitive composition containing the photosensitive resin.

2. Background Art

Semiconductor devices; for example, highly integrated circuit elements such as DRAM, have been required to have higher density, higher degree of integration, or higher operational speed. Accordingly, in the field of production of various electronic devices, keen demand has arisen for establishment of a half-micron-order micro-fabrication technique; for example, development of a photolithographic technique for micro-patterning. In photolithography, one means for micro-patterning is employment of active radiation (exposure light) of short wavelength for photoresist patterning. In a demagnification projection aligner, resolution (R) is represented by Rayleigh's equation: $R = k \cdot \lambda / NA$ (wherein $\lambda$ represents the wavelength of exposure light, NA represents the numerical aperture of a lens, and k represents a process factor), and therefore, resolution can be enhanced by reducing the wavelength $\lambda$ of active radiation (exposure light) employed for resist patterning.

Chemically amplified photoresists have been proposed as being suitable for use in light of short wavelength (see, for example, Patent Document 1). A characteristic feature of a chemically amplified photoresist resides in that a protonic acid is generated from a photoacid generator (i.e., a component of the photoresist) through irradiation with exposure light, and, through thermal treatment following light exposure, the protonic acid catalytically reacts with, for example, a polymer having an acid-dissociable group (i.e., a group that is dissociated/degraded by an acid). Most currently developed photoresists are of a chemically amplified type. A variety of sulfonium salts have been known as photoacid generators for use in such a chemically amplified photoresist.

However, such a conventional sulfonium salt photoacid generator poses a problem in that, for example, it has poor compatibility with a polymer having an acid-dissociable group, the polymer being a primary component of a photoresist. Needless to say, such a problem adversely affects a patterning process; for example, when a photoresist containing a sulfonium salt photoacid generator is exposed to active radiation for patterning, the thus-formed pattern may fail to attain a predetermined shape.

[Patent Document 1]
U.S. Pat. No. 4,491,628

SUMMARY OF THE INVENTION

In view of the foregoing, an object of the present invention is to provide a photosensitive resin which realizes formation of a pattern having a good shape, without involving a problem in terms of poor compatibility between an acid generator and a primary-component polymer having an acid-dissociable group, and a photosensitive composition containing the photosensitive resin.

In a first mode of the present invention for solving the aforementioned problems, there is provided a photosensitive resin characterized by comprising a repeating unit represented by formula (1):

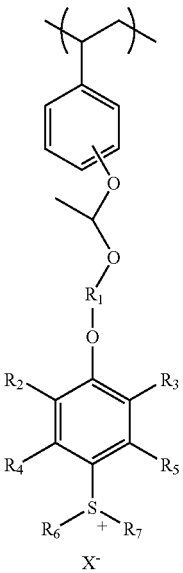

(1)

(wherein $R_1$ represents a C2-C9 linear or branched divalent hydrocarbon group; each of $R_2$ to $R_5$ represents a hydrogen atom or a C1-C3 linear or branched hydrocarbon group; each of $R_6$ and $R_7$ represents an organic group, wherein $R_6$ and $R_7$ may together form a divalent organic group; and $X^-$ represents an anion);

at least one of a repeating unit represented by formula (2):

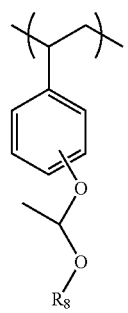

(2)

(wherein $R_8$ represents a C2-C9 linear or branched hydrocarbon group) and a repeating unit represented by formula (3):

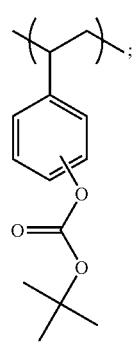

(3)

a repeating unit represented by formula (4):

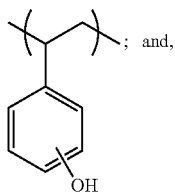

(4)

optionally, a repeating unit represented by formula (5).

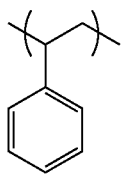

(5)

A second mode of the present invention is drawn to a specific embodiment of the photosensitive resin according to the first mode, wherein the anion represented by X⁻ is an anion represented by formula (6):

(6)

(wherein each of k, m, and n represents an integer of 0 or more, wherein when m is 0, k is an integer of 1 to 8, and n is 2k+1, the anion of formula (6) is a perfluoroalkylsulfonate ion); when n is 0, k is an integer of 1 to 15, and m is an integer of 1 or more, the anion of formula (6) is an alkylsulfonate ion, a benzenesulfonate ion, or an alkylbenzenesulfonate ion; or when each of m and n is an integer of 1 or more, and k is an integer of 1 to 10, the anion of formula (6) is a fluorine-substituted benzenesulfonate ion, a fluorine-substituted alkylbenzenesulfonate ion, or a fluorine-substituted alkylsulfonate ion).

A third mode of the present invention is drawn to a specific embodiment of the photosensitive resin according to the first mode, wherein the anion represented by X⁻ is a bis(perfluoroalkylsulfon)imide ion represented by formula (7):

(7)

(wherein p represents an integer of 1 to 8).

A fourth mode of the present invention is drawn to a specific embodiment of the photosensitive resin according to the first mode, wherein the anion represented by X⁻ is an anion represented by formula (8).

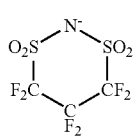

(8)

A fifth mode of the present invention is drawn to a specific embodiment of the photosensitive resin according to any of the first to fourth modes, wherein the photosensitive resin has a weight average molecular weight of 2,000 to 100,000, and numbers of repeating units a, b, c, d, and e satisfy the following relations: a/(a+b+c+d+e)=0.001 to 0.3; (b+c)/(a+b+c+d+e)=0.1 to 0.5; (d+e)/(a+b+c+d+e)=0.5 to 0.8; and e/(d+e)=0 to 0.2, wherein a represents the number of repeating units of formula (1); b represents the number of repeating units of formula (2); c represents the number of repeating units of formula (3); d represents the number of repeating units of formula (4); and e represents the number of repeating units of formula (5).

A sixth mode of the present invention is drawn to a specific embodiment of the photosensitive resin according to any of the first to fifth modes, wherein the resin has a main chain having a terminal group which is a hydrogen atom or a methyl group.

In a seventh mode of the present invention, there is provided a photosensitive composition characterized by being a solution of a photosensitive resin as recited in any of the first to sixth modes dissolved in an organic solvent.

According to the present invention, there can be provided a photosensitive resin including a moiety serving as a photoacid generator, and an acid-dissociable group. When the photosensitive resin is dissolved in a solvent, the resin can provide a chemically amplified photosensitive composition without using an acid generator. Therefore, the photosensitive resin realizes formation of a pattern having a good shape, without involving a problem in terms of poor compatibility between an acid generator and a polymer having an acid-dissociable group.

DETAILED DESCRIPTION OF THE PREFERRED EMBODIMENTS

The present invention will next be described in detail.

The photosensitive resin of the present invention is a polymer which includes a repeating unit represented by formula (1), at least one of a repeating unit represented by formula (2) and a repeating unit represented by formula (3), a repeating unit represented by formula (4), and, if necessary, a repeating unit represented by formula (5), and which has a moiety serving as a photoacid generator derived from a sulfonium salt, and an acid-dissociable group. Since the photosensitive resin of the present invention has a moiety serving as a photoacid generator, and an acid-dissociable group, when the photosensitive resin is dissolved in a solvent, the resin can provide a chemically amplified photosensitive composition without using an acid generator. Therefore, when employed in a photosensitive composition, the photosensitive resin realizes formation of a pattern having a good shape, without involving a problem in terms of poor compatibility between an acid generator and a polymer having an acid-dissociable group.

Specifically, the repeating unit represented by formula (1) has a moiety serving as a photoacid generator which generates an acid through exposure to active radiation, and an acid-dissociable group; i.e., a group which can be dissociated in the presence of the acid generated from the acid-generator.

The repeating unit represented by formula (2) or (3) has a structure obtained through modification, with an acid-dissociable group, of the phenolic hydroxyl group of a repeating unit represented by formula (4). The repeating unit represented by formula (4) or (5) determines the solubility of the photosensitive resin in an alkaline developer, and the solubility can be controlled through regulation of the amount of the repeating unit.

The photosensitive resin of the present invention itself is insoluble or very difficult to dissolve in an alkaline developer. However, when the photosensitive resin is exposed to active radiation, an acid is generated from a repeating unit represented by formula (1), and the thus-generated acid induces dissociation of an acid-dissociable group of a repeating unit represented by formula (1), (2), or (3), whereby the solubility of the photosensitive resin in an alkaline developer is enhanced.

In formula (1), $R_1$ is a C2-C9 divalent hydrocarbon group, which may be linear or branched. Each of $R_2$ to $R_5$ is a hydrogen atom or a C1-C3 linear or branched hydrocarbon group. Each of $R_6$ and $R_7$ is an organic group. Examples of the organic group include linear, branched, and alicyclic alkyl groups. Other examples of the organic group include carbocyclic aryl groups and heterocyclic aryl groups. Preferred organic groups are carbocyclic aryl groups, and particularly preferred organic groups are a phenyl group, a methylphenyl group, and a t-butylphenyl group. Any of the aforementioned carbocyclic aryl groups and heterocyclic aryl groups may have a C1-C30 substituent. The C1-C30 substituent is preferably a C1-C30 hydrocarbon group or alkoxy group. Examples of the C1-C30 hydrocarbon group serving as a substituent include alkyl groups such as methyl, ethyl, propyl, isopropyl, n-butyl, sec-butyl, t-butyl, pentyl, hexyl, heptyl, octyl, t-amyl, decanyl, dodecanyl, and hexadecanyl; alicyclic alkyl groups such as cyclopropyl, cyclopentyl, cyclohexyl, cyclooctyl, cyclododecanyl, cyclohexadecanyl, and adamantyl; and aryl groups such as phenyl and naphthyl. Examples of the C1-C30 alkoxy group serving as a substituent include methoxy, ethoxy, propoxy, isopropoxy, n-butoxy, isobutoxy, sec-butoxy, t-butoxy, pentyloxy, t-amyloxy, n-hexyloxy, n-octyloxy, n-dodecanoxy, and 1-adamantyloxy.

$R_6$ and $R_7$ may bond together to form a ring. In this case, $R_6$ and $R_7$ form a divalent organic group —$R_6$-$R_7$— including any of the aforementioned carbon skeletons. Examples of such a divalent organic group include C3-C9 alicyclic alkyl groups formed through bonding of $R_6$ and $R_7$ via a saturated carbon skeleton. Examples of preferred C3-C9 alicyclic alkyl groups include polymethylene groups such as tetramethylene and pentamethylene. The ring formed by S and the divalent organic group —$R_6$-$R_7$— is preferably a four- to eight-membered ring, more preferably a five- to six-membered ring.

No particular limitation is imposed on the anion represented by $X^-$ in formula (1), and the anion $X^-$ may be an anion which has conventionally been employed in a photoacid generator. Examples of the anion include an anion represented by formula (6), an anion represented by formula (7), and the anion represented by formula (8) (cyclo-1,3-perfluoropropanedisulfonimide ion).

In formula (6), each of k, m, and n represents an integer of 0 or more. When m is 0, k is an integer of 1 to 8, and n is 2k+1, the anion of formula (6) is a perfluoroalkylsulfonate ion. Examples of preferred perfluoroalkylsulfonate ions include $CF_3SO_3^-$ (trifluoromethanesulfonate ion), $C_4F_9SO_3^-$ (nonafluorobutanesulfonate ion), and $C_8F_{17}SO_3^-$ (heptadecafluorooctanesulfonate ion).

In formula (6), when n is 0, k is an integer of 1 to 15, and m is an integer of 1 or more; the anion of formula (6) is an alkylsulfonate ion, a benzenesulfonate ion, or an alkylbenzenesulfonate ion. When the anion of formula (6) is an alkylsulfonate ion, m is represented by 2k+1. Examples of preferred alkylsulfonate ions include $CH_3SO_3^-$ (methanesulfonate ion), $C_2H_5SO_3^-$ (ethanesulfonate ion) $C_9H_{19}SO_3^-$ (1-nonanesulfonate ion), and a cross-linked cyclic alkylsulfonate ion such as 10-camphorsulfonate ion.

Examples of preferred alkylbenzenesulfonate ions include 4-methylbenzenesulfonate ion and 2,4,6-triisopropylbenzenesulfonate ion.

In formula (6), when each of m and n is an integer of 1 or more, and k is an integer of 1 to 10, the anion of formula (6) is a fluorine-substituted benzenesulfonate ion, a fluorine-substituted alkylbenzenesulfonate ion, or a fluorine-substituted alkylsulfonate ion. Examples of preferred fluorine-substituted benzenesulfonate ions include 2-fluorobenzenesulfonate ion, 4-fluorobenzenesulfonate ion, 2,4-difluorobenzenesulfonate ion, and pentafluorobenzenesulfonate ion. Examples of preferred fluorine-substituted alkylbenzenesulfonate ions include 2-trifluoromethylbenzenesulfonate ion, 4-trifluoromethylbenzenesulfonate ion, 2,4-bis(trifluoromethyl)benzenesulfonate ion, and 3,5-bis(trifluoromethyl)benzenesulfonate ion. Examples of preferred fluorine-substituted alkylsulfonate ions include 1,1,2,3,3,3-hexafluoropropanesulfonate ion.

In formula (7), which represents a bis(perfluoroalkylsulfon)imide ion, p is an integer of 1 to 8. Examples of preferred bis(perfluoroalkylsulfon)imide ions include bis(trifluoromethanesulfon)imide ion and bis(pentafluoroethanesulfon)imide ion.

Preferably, the photosensitive resin of the present invention has a main chain having a terminal group which is a hydrogen atom or a methyl group. The terminal group can be determined as desired on the basis of a polymerization initiator and a polymerization terminator employed for synthesis of a base polymer.

The photosensitive resin of the present invention preferably has a weight average molecular weight of 2,000 to 100,000, more preferably 2,000 to 50,000. This is because when the weight average molecular weight is low, exposure sensitivity is reduced, and a cured film exhibits lowered strength, whereas when the weight average molecular weight is high, adhesion to a substrate is reduced, resulting in difficulty in patterning. The aforementioned weight average molecular weight of the photosensitive resin of the present invention refers to weight average molecular weight (Mw) as reduced to polystyrene, which is measured through gel permeation chromatography (GPC). The ratio of Mw to GPC-measured number average molecular weight (Mn) as reduced to polystyrene; i.e., Mw/Mn, is typically 1 to 3, preferably 1 to 2.5. Preferably, the numbers of repeating units a, b, c, d, and e satisfy the following relations: a/(a+b+c+d+e)=0.001 to 0.3; (b+c)/(a+b+c+d+e)=0.1 to 0.5; (d+e)/(a+b+c+d+e)=0.5 to 0.8; and e/(d+e)=0 to 0.2, wherein a represents the number of repeating units of formula (1); b represents the number of repeating units of formula (2); c represents the number of repeating units of formula (3); d represents the number of repeating units of formula (4); and e represents the number of repeating units of formula (5). When the relation: a/(a+b+c+d+e)=0.001 to 0.3 is satisfied, the amount of the structure of formula (1), which generates an acid through exposure to light, is a catalytic amount, and the moiety serves well as an acid generator When the relation: (b+c)/(a+b+c+d+e)=0.1 to 0.5 is satisfied, there is exhibited the effect of suppressing dissolution of the photosensitive resin in an alkaline developer. When the relations: (d+e)/(a+b+c+d+e)=0.5 to 0.8, and e/(d+e)=0 to 0.2 are satisfied, there are exhibited the effect of improving adhesion of the photosensitive resin to an application target (e.g., a substrate), and the effect of improving solubility of the resin in an alkaline developer.

The photosensitive resin of the present invention may include, in the structure thereof, another moiety in addition to the respective repeating units represented by formulas (1) to (5), so long as the structure does not impede the effects of the present invention.

No particular limitation is imposed on the method for producing the photosensitive resin of the present invention, and, for example, the photosensitive resin may be produced by adding a compound selected from the below-described formulas (13) to (15) to polyhydroxystyrene or a poly(hydroxystyrene-styrene) copolymer.

The repeating unit represented by formula (1) may be introduced through, for example, the following method. Firstly, as shown in the following reaction scheme, a compound represented by formula (9) is reacted with a dialkyl sulfoxide in methanesulfonic acid ($CH_3SO_3H$) in the presence of diphosphorus pentoxide ($P_2O_5$) serving as a catalyst, to thereby yield a compound represented by formula (10) (methanesulfonate salt). The dialkyl sulfoxide employed can be readily obtained through oxidation of a corresponding dialkyl sulfide with hydrogen peroxide.

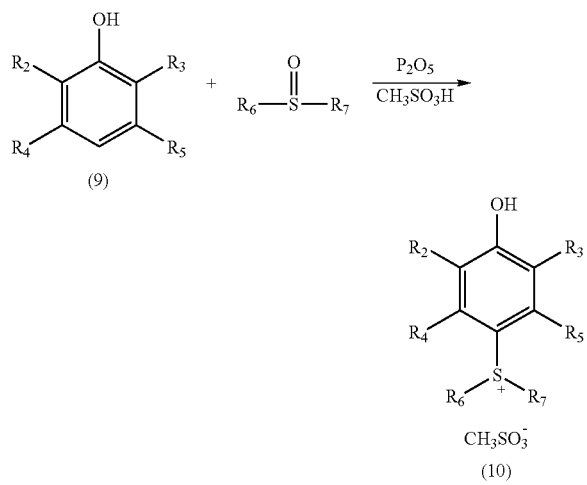

The amount of diphosphorus pentoxide employed as a catalyst is 0.1 to 3.0 mol, preferably 0.5 to 1.5 mol, on the basis of 1 mol of a compound represented by formula (9) The amount of methanesulfonic acid employed is 1 to 10 mol, preferably 4 to 6 mol, on the basis of 1 mol of a compound represented by formula (9). The reaction temperature is typically 0 to 50° C., preferably 10 to 30° C., and the reaction time is typically one to 15 hours, preferably three to eight hours. The reaction is terminated through addition of water.

Subsequently, as shown in the following reaction scheme, $CH_3SO_3^-$ of a compound represented by formula (10) is exchanged with $X^-$. In the following reaction scheme, $M^+$ represents a monovalent metal ion. Specifically, an acid $H^+X^-$ or a salt $M^+X^-$ ($X^-$ is, for example, an anion represented by formula (6), (7), or (8)) is added to an aqueous solution of a compound represented by formula (10) in an amount of 1 to 2 mol (preferably 1.05 to 1.2 mol) on the basis of 1 mol of the compound of formula (10). A reaction solvent employed is preferably a chlorine-containing solvent (e.g., dichloromethane or chloroform). The reaction temperature is typically 10 to 50° C., preferably 20 to 30° C. After completion of reaction, the aqueous layer is separated from the reaction mixture, and the organic layer is further washed with water. After completion of washing, a compound represented by formula (11) is recovered through crystallization from an appropriate recrystallization solvent. Alternatively, after production of a compound represented by formula (10), potassium iodide may be added to the resultant reaction mixture for salt exchange of the compound of formula (10), to thereby yield a solid. After purification, the solid may be subjected to salt exchange with $X^-$. Alternatively, iodide may also be substituted through salt exchange by use of a sulfonate ester.

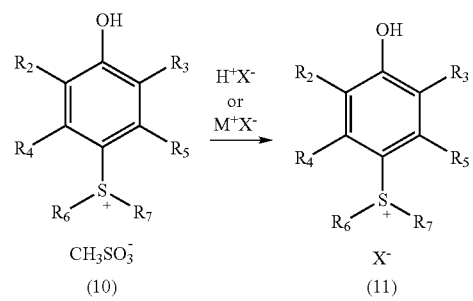

Thereafter, as shown in the following reaction scheme, the compound represented by formula (11) and a compound represented by formula (12) are subjected to hydrogen halide-removing reaction, to thereby yield a sulfonium salt represented by formula (13). In the following reaction scheme, Y represents a halogen atom such as Cl or Br. Specifically, for example, the compound represented by formula (11) is reacted with the compound represented by formula (12) in a polar solvent in the presence of a base catalyst such as potassium carbonate ($K_2O_3$) The reaction temperature is typically 60 to 90° C. After completion of reaction, water is added to the reaction mixture, and the aqueous layer is washed with a nonpolar solvent (e.g., hexane), followed by extraction with a chlorine-containing solvent. Thereafter, the organic layer is separated from the extract, and washed with water, followed by removal of the chlorine-containing solvent through evaporation, to thereby yield a sulfonium salt represented by formula (13). Compounds of formulas (9) to (12) may be commercially available ones.

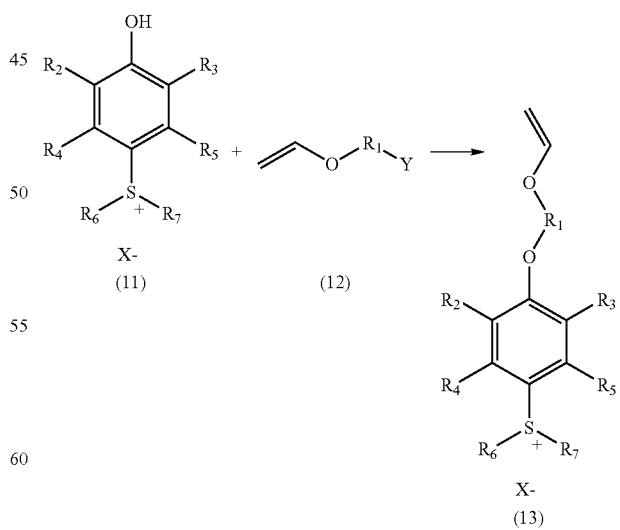

When a compound represented by formula (13) is reacted with polyhydroxystyrene or a poly(hydroxystyrene-styrene) copolymer in an organic solvent (e.g., 1,3-dioxolan) in the presence of an acidic catalyst, a repeating unit represented by formula (1) can be introduced.

The repeating unit represented by formula (2) may be introduced by adding a vinyl ether represented by the following formula (14):

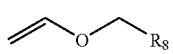
(14)

(wherein $R_8$ represents a C2-C9 linear or branched hydrocarbon group) to hydroxystyrene or a poly(hydroxystyrene-styrene) copolymer in an organic solvent (e.g., 1,3-dioxolan) in the presence of an acidic catalyst.

The repeating unit represented by formula (3) may be produced by reacting di-t-butyl dicarbonate represented by the following formula (15):

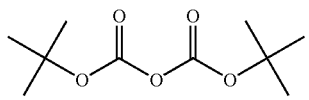
(15)

with polyhydroxystyrene or a poly(hydroxystyrene-styrene) copolymer in an organic solvent (e.g., 1,3-dioxolan) in the presence of a base catalyst.

The photosensitive resin of the present invention may be produced through appropriate reaction of a polymer having repeating units represented by formulas (1) to (5). Alternatively, the photosensitive resin of the present invention may be produced through copolymerization of repeating units (monomers) represented by formulas (1) to (5) in an organic solvent by use of a polymerization initiator. Examples of preferred organic solvents include ethers such as tetrahydrofuran (THF), 1,3-dioxolan, and 1,3-dioxane; and propylene glycol monoalkyl ethers such as propylene glycol monomethyl ether acetate. The polymerization initiator employed may be any known one (e.g., a thermal polymerization initiator, a photopolymerization initiator, or a redox initiator), and is appropriately selected in consideration of, for example, easy handling, or easy control of reaction rate and molecular weight.

Specific examples of the resin production method will next be described. A photosensitive resin of type 1 described below in Table 1 is produced by, for example, adding the compound of formula (14) and the compound of formula (13) to polyhydroxystyrene in any of the aforementioned organic solvents in the presence of an acid catalyst. A photosensitive resin of type 2 is produced by adding the compound of formula (13) to polyhydroxystyrene in any of the aforementioned organic solvents in the presence of an acid catalyst, followed by reaction through addition of a base catalyst and the compound of formula (15). A photosensitive resin of type 3 is produced by adding the compound of formula (14) and the compound of formula (13) to polyhydroxystyrene in any of the aforementioned organic solvents in the presence of an acid catalyst, followed by reaction through addition of a base catalyst and the compound of formula (15). A photosensitive resin of type 4 is produced by adding the compound of formula (14) and the compound of formula (13) to poly(hydroxystyrene-styrene) in any of the aforementioned organic solvents in the presence of an acid catalyst. A photosensitive resin of type 5 is produced by adding the compound of formula (13) to poly(hydroxystyrene-styrene) in any of the aforementioned organic solvents in the presence of an acid catalyst, followed by reaction through addition of a base catalyst and the compound of formula (15). A photosensitive resin of type 6 is produced by adding the compound of formula (14) and the compound of formula (13) to poly(hydroxystyrene-styrene) in any of the aforementioned organic solvents in the presence of an acid catalyst, followed by reaction through addition of a base catalyst and the compound of formula (15).

TABLE 1

| | Presence or absence of repeating unit in resin structure (present: ○, absent: —) | | | | |
|---|---|---|---|---|---|
| | Formula (1) | Formula (2) | Formula (3) | Formula (4) | Formula (5) |
| Type 1 | ○ | ○ | — | ○ | — |
| Type 2 | ○ | — | ○ | ○ | — |
| Type 3 | ○ | ○ | ○ | ○ | — |
| Type 4 | ○ | ○ | — | ○ | ○ |
| Type 5 | ○ | — | ○ | ○ | ○ |
| Type 6 | ○ | ○ | ○ | ○ | ○ |

The photosensitive composition of the present invention is prepared by dissolving the aforementioned photosensitive resin of the present invention in an organic solvent. Since the photosensitive resin of the present invention includes a moiety serving as a photoacid generator, and an acid-dissociable group, when the photosensitive resin is dissolved in a solvent, the resin can provide a chemically amplified photosensitive composition without using an acid generator. Therefore, the photosensitive composition is in the form of uniform solution, without involving a problem in terms of poor compatibility between an acid generator and a polymer having an acid-dissociable group. A pattern of interest can be formed by use of the photosensitive composition.

Examples of the organic solvent for preparing the photosensitive composition include ethylene glycol monoalkyl ethers, ethylene glycol monoalkyl ether acetates, diethylene glycol dialkyl ether acetates, propylene glycol monoalkyl ethers, propylene glycol monoalkyl ether acetates, and propylene glycol dialkyl ether acetates. The amount of the photosensitive resin of the present invention contained in the photosensitive composition may be appropriately determined within such a range that the photosensitive resin can be dissolved therein, but in general the photosensitive resin content is preferably 3 to 30 wt. %.

The photosensitive composition of the present invention preferably contains a so-called acid diffusion controlling agent which exhibits, for example, the effect of controlling diffusion, in a resist film, of an acid generated from a repeating unit of formula (1) through exposure to light, thereby suppressing undesired chemical reaction in an unexposed area. The acid diffusion controlling agent employed is preferably a nitrogen-containing organic compound whose basicity does not change through light exposure or thermal treatment. The amount of the acid diffusion controlling agent employed is typically 0.005 to 5 wt. % on the basis of that of the photosensitive resin. This is because an increase in amount of the acid diffusion controlling agent employed tends to cause deterioration of the sensitivity or developing property of the photosensitive composition serving as a resist, whereas a decrease in amount of the acid diffusion controlling agent employed results in insufficient effect of improving, for example, the resolution of the composition serving as a resist, or process stability.

If necessary, the photosensitive composition of the present invention may contain an additive such as a surfactant, a sensitizer, or an anti-foaming agent.

When a resist pattern is formed by use of the photosensitive composition of the present invention, the photosensitive composition is applied onto a substrate (e.g., a silicon wafer) through appropriate application means such as spin coating or flow coating, to thereby form a resist film, and, if necessary, the film is thermally treated, followed by exposure of the film to light via a mask having a predetermined pattern. Active radiation employed in light exposure is appropriately selected from among deep UV rays, electron beams, X-rays, EUV (extreme UV) rays, etc. in consideration of, for example, the width of a micropattern or the sensitivity of the photosensitive composition. Light exposure conditions (e.g., exposure dose) are appropriately determined in consideration of, for example, the formulation of the photosensitive composition, or the type of an additive employed. Thermal treatment is preferably performed after light exposure, and thermal treatment conditions are appropriately determined in consideration of, for example, the formulation of the photosensitive composition, or the type of an additive employed.

Subsequently, the resist film which has been patterned through light exposure is developed by use of an alkaline developer, to thereby form a predetermined resist pattern. The alkaline developer employed is, for example, an aqueous alkaline solution prepared by dissolving, in water, an alkaline compound such as an alkali metal hydroxide, aqueous ammonia, a mono-, di-, or tri-alkylamine, a tetraalkylammonium hydroxide, or choline so that the alkaline compound concentration is typically 1 to 5 wt. %. When such an aqueous alkaline solution developer is employed, generally, development is followed by washing with water.

EXAMPLES

The present invention will next be described by way of examples, which should not be construed as limiting the invention thereto.

Synthesis Example 1

Synthesis of the Compound Represented by the Following Formula
(4-vinyloxyethoxyphenyldiphenylsulfonium perfluorobutanesulfonate)

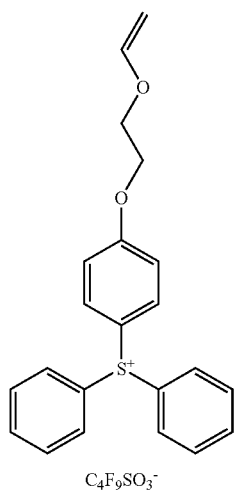

$C_4F_9SO_3^-$

4-Hydroxyphenyldiphenylsulfonium perfluorobutanesulfonate (52.2 g), potassium carbonate (18.0 g), and N,N,N',N'-tetramethylethylenediamine (1.05 g) were dissolved in dimethyl sulfoxide (26.1 g). Subsequently, chloroethyl vinyl ether (13.9 g) was added to the resultant solution, followed by heating to 80° C. and stirring for 15 hours. The resultant reaction mixture was cooled to 30° C. or lower. After removal of solid matter through filtration, water (100 g) was added to the filtrate, and the aqueous layer was washed thrice with hexane (100 g). Dichloromethane (209 g) and water (260 g) were added to the washed aqueous layer, followed by stirring for extraction of a target substance into the dichloromethane layer. The organic layer was repeatedly washed with distilled water until the pH of the separated aqueous layer became 7. The solvent was removed by means of a rotary evaporator, to thereby yield. 69.9 g of an oily substance. Through $^1$H-NMR analysis and ion chromatography, this substance was identified to be 4-vinyloxyethoxyphenyldiphenylsulfonium perfluorobutanesulfonate.

$^1$H-NMR (400 MHz, CDCl$_3$) δ4.05-4.08 (m,3H), 4.24 (d,J=7.4,2.4 Hz,1H), 4.31-4.33 (m,2H), 6.49 (dd,J=14.4,7.4 Hz,1H), 7.24 (d,J=6.8 Hz,2H), 7.64-7.74(m,12H)

Synthesis Example 2
Synthesis of the Compound Represented by the Following Formula (4-vinyloxyethoxy-3,5-dimethylphenyldi(4-t-butylphenyl)sulfonium perfluorobutanesulfonate

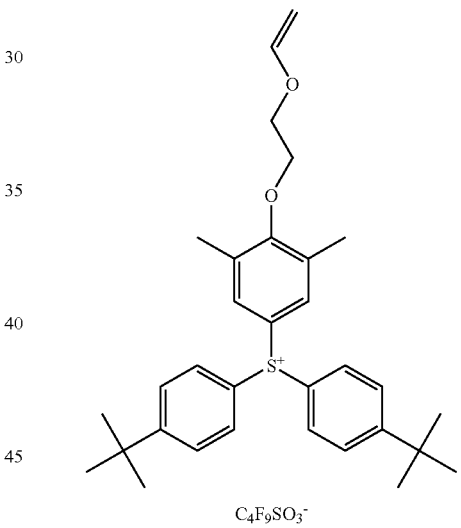

$C_4F_9SO_3^-$

4-Hydroxy-3,5-dimethylphenyldi(4-t-butylphenyl)sulfonium perfluorobutanesulfonate (28.6 g), potassium carbonate (8.10 g), and N,N,N',N'-tetramethylethylenediamine (0.46 g) were dissolved in dimethyl sulfoxide (142 g). Subsequently, chloroethyl vinyl ether (6.08 g) was added to the resultant solution, followed by heating to 80° C. and stirring for 19 hours. The resultant reaction mixture was cooled to 30° C. or lower. After removal of solid matter through filtration, water (20.9 g) was added to the filtrate, and the aqueous layer was washed thrice with hexane (85.1 g). Dichloromethane (226 g) and water (141 g) were added to the washed aqueous layer, followed by stirring for extraction of a target substance into the dichloromethane layer. The organic layer was repeatedly washed with distilled water until the pH of the separated aqueous layer became 7. The solvent was removed by means of a rotary evaporator, to thereby yield 27.4 g of a brown oily substance. Through $^1$H-NMR analysis and ion chromatography, this substance was identified to be 4-vinyloxyethoxy-3,5-dimethylphenyldi(4-t-butylphenyl)sulfonium perfluorobutanesulfonate.

$^1$H-NMR (400 MHz, CDCl$_3$) δ1.35 (s,18H), 2.36 (s,6H), 4.02-4.08 (m,3H) 4.12-4.14 (m,2H), 4.25 (d,J=14.3,6.1 Hz,1H), 6.50 (dd,J=14.3,6.6 Hz,1H), 7.35 (s,2H), 7.59-7.75 (m,8H)

Synthesis Example 3

Synthesis of the Compound Represented by the Following Formula (4-vinyloxyoctoxyphenyldiphenylsulfonium perfluorobutanesulfonate)

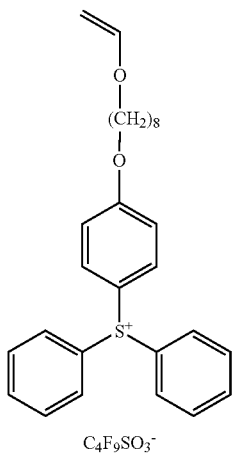

8-Chloro-1-octanol (1.23 g), sodium carbonate (0.47 g), di-μ-chlorobis[η-cyclooctadieneiridium(I)] (0.47 g), and vinyl acetate (1.31 g) were added to toluene (6.15 g), and the resultant mixture was stirred at 100° C. for four hours. After cooling of the mixture to room temperature, the solvent was removed through evaporation. The resultant product was purified through column chromatography by use of a solvent mixture of hexane and dichloromethane (2:1 by volume), to thereby yield 1.16 g of 8-chlorooctyl vinyl ether as a colorless, transparent liquid.

4-Hydroxyphenyldiphenylsulfonium perfluorobutanesulfonate (2.67 g), potassium carbonate (0.78 g), and N,N,N', N'-tetramethylethylenediamine (0.05 g) were dissolved in dimethyl sulfoxide (13.3 g). Subsequently, 8-chlorooctyl vinyl ether (1.05 g) was added to the resultant solution, followed by heating to 80° C. and stirring for 15 hours. The resultant reaction mixture was cooled to 30° C. or lower. After removal of solid matter through filtration, water (13.3 g) was added to the filtrate, and the aqueous layer was washed thrice with hexane (7.96 g). Dichloromethane (10.6 g) and water (g) were added to the washed aqueous layer, followed by stirring for extraction of a target substance into the dichloromethane layer. The organic layer was repeatedly washed with distilled water until the pH of the separated aqueous layer became 7. The solvent was removed by means of a rotary evaporator, to thereby yield 2.53 g of a brown oily substance. Through $^1$H-NMR analysis and ion chromatography, this substance was identified to be 4-vinyloxyoctoxyphenyldiphenylsulfonium perfluorobutanesulfonate.

$^1$H-NMR (400 MHz, CDCl$_3$) δ1.36-1.47 (m,8H), 1.64-1.67 (m,2H), 1.78-1.83 (m,2H), 3.67 (t,J=6.6 Hz,2H), 3.96 (dd,J=6.8,2.0 Hz,1H), 4.04 (t,J=6.6 Hz,2H), 4.16 (dd,J=14.4, 2.0 Hz,1H), 6.46(dd,J=14.4,6.8 Hz,1H), 7.16-7.19 (m,2H), 7.65-7.76 (m,12H)

Synthesis Example 4

Synthesis of the Compound Represented by the Following Formula (4-vinyloxyethoxyphenyldiphenylsulfonium cyclo(1,3-perfluoropropanedisulfon)imide

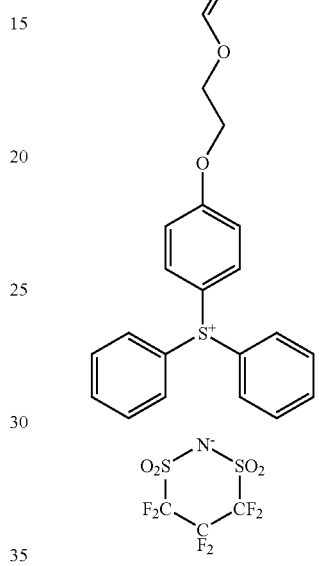

Diphosphorus pentoxide (4.66 g) and diphenyl sulfoxide (13.3 g) were dissolved in methanesulfonic acid (63.1 g), and then phenol (9.26 g) was added to the resultant solution, followed by stirring at room temperature for 15 hours. While the resultant mixture was maintained at 30° C. or lower, water (199 g) was added dropwise to the mixture. The thus-obtained aqueous layer was washed thrice with t-butyl methyl ether (66.4 g), and then dichloromethane (120 g) and potassium cyclo-1,3-perfluoropropanedisulfonimide (23.9 g) were added to the washed aqueous layer, followed by stirring for two hours. After termination of stirring, the thus-separated aqueous layer was removed, and then 0.1 wt. % aqueous ammonia solution (66.4 g) was added to the organic layer, followed by stirring. Subsequently, the organic layer was repeatedly washed with distilled water until the pH of the separated aqueous layer became 7. The solvent was removed by means of a rotary evaporator, to thereby yield 32.1 g of 4-hydroxyphenyldiphenylsulfonium cyclo(1,3-perfluoropropanedisulfon)imide as a brown oily substance.

4-Hydroxyphenyldiphenylsulfonium cyclo(1,3-perfluoropropanedisulfon)imide (32.1 g), potassium carbonate (11.2 g), and N,N,N',N'-tetramethylethylenediamine (0.67 g) were dissolved in dimethyl sulfoxide (164 g). Subsequently, chloroethyl vinyl ether (8.65 g) was added to the resultant solution, followed by heating to 80° C. and stirring for 15 hours. The resultant reaction mixture was cooled to 30° C. or lower. After removal of solid matter through filtration, water (80 g) was added to the filtrate, and the aqueous layer was washed thrice with hexane (40 g). Dichloromethane (120 g) and water (260 g) were added to the washed aqueous layer, followed by stirring for extraction of a target substance into the dichloromethane layer. The organic layer was repeatedly washed with distilled water until the pH of the separated aqueous layer became 7. The solvent was removed by means of a rotary evaporator, to thereby yield 29.1 g of an oily substance. Through ¹H-NMR analysis and ion chromatography, this substance was identified to be 4-vinyloxyethoxyphenyldiphenylsulfonium cyclo(1,3-perfluoropropanedisulfon)imide.

¹H-NMR (400 MHz, CDCl₃) δ4.05-4.08 (m,3H), 4.24 (d,J=7.4,2.4 Hz,1H), 4.31-4.33 (m,2H), 6.49 (dd,J=14.4,7.4 Hz,1H), 7.24 (d,J=6.8 Hz,2H), 7.64-7.74 (m,12H)

Synthesis Example 5

Synthesis of the Compound Represented by the Following Formula
(4-vinyloxyethoxyphenyldiphenylsulfonium bis(perfluoromethanesulfon)imide

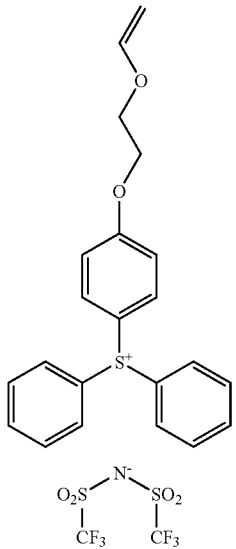

Diphosphorus pentoxide (2.33 g) and diphenyl sulfoxide (6.65 g) were dissolved in methanesulfonic acid (31.5 g), and then phenol (4.80 g) was added to the resultant solution, followed by stirring at room temperature for 15 hours. While the resultant mixture was maintained at 30° C. or lower, water (100 g) was added dropwise to the mixture. The thus-obtained aqueous layer was washed thrice with t-butyl methyl ether (30 g), and then dichloromethane (60 g) and potassium bis(perfluoromethanesulfonimide) (11.6 g) were added to the washed aqueous layer, followed by stirring for two hours. After termination of stirring, the thus-separated aqueous layer was removed, and then 0.1 wt. % aqueous ammonia solution (30 g) was added to the organic layer, followed by stirring. Subsequently, the organic layer was repeatedly washed with distilled water until the pH of the separated aqueous layer became 7. The solvent was removed by means of a rotary evaporator, to thereby yield 16.1 g of 4-hydroxyphenyldiphenylsulfonium bis(perfluoromethanesulfon)imide as a brown oily substance.

4-Hydroxyphenyldiphenylsulfonium bis(perfluoromethanesulfon)imide (16 g), potassium carbonate (4.7 g), and N,N,N',N'-tetramethylethylenediamine (0.33 g) were dissolved in dimethyl sulfoxide (80 g). Subsequently, chloroethyl vinyl ether (3.66 g) was added to the resultant solution, followed by heating to 80° C. and stirring for 15 hours. The resultant reaction mixture was cooled to 30° C. or lower. After removal of solid matter through filtration, water (40 g) was added to the filtrate, and the aqueous layer was washed thrice with hexane (30 g). Dichloromethane (60 g) and water (120 g) were added to the washed aqueous layer, followed by stirring for extraction of a target substance into the dichloromethane layer. The organic layer was repeatedly washed with distilled water until the pH of the separated aqueous layer became 7. The solvent was removed by means of a rotary evaporator, to thereby yield 14.4 g of an oily substance. Through ¹H-NMR analysis and ion chromatography, this substance was identified to be 4-vinyloxyethoxyphenyldiphenylsulfonium bis(perfluoromethanesulfon)imide.

¹H-NMR (400 MHz, CDCl₃) δ4.05-4.08 (m,3H), 4.24 (d,J=7.4,2.4 Hz,1H), 4.31-4.33 (m,2H), 6.49 (dd,J=14.4,7.4 Hz,1H), 7.24 (d,J=6.8 Hz,2H), 7.64-7.74 (m,12H)

Synthesis Example 6

Synthesis of 4-vinyloxyethoxyphenyldi(4-t-butylphenyl)sulfonium 2,4,6-triisopropylbenzenesulfonate

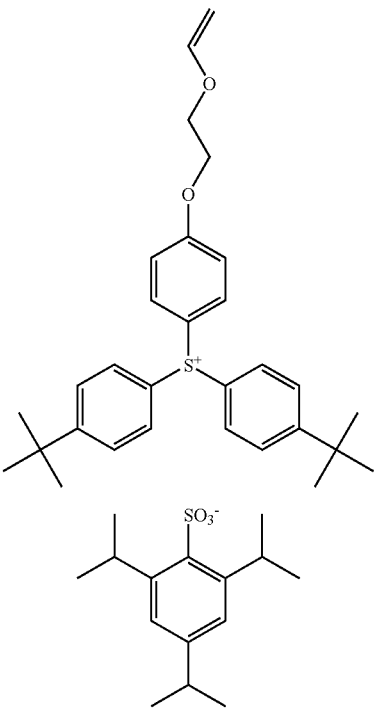

4-Hydroxyphenyldi(4-t-butylphenyl)sulfonium 2,4,6-triisopropylbenzenesulfonate (5.0 g), potassium carbonate (1.28 g), and N,N,N',N'-tetramethylethylenediamine (0.10 g) were dissolved in dimethyl sulfoxide (15 g). Subsequently, chloroethyl vinyl ether (0.83 g) was added to the resultant solution, followed by heating to 80° C. and stirring for 15 hours. The resultant reaction mixture was cooled to 30° C. or lower. After removal of solid matter through filtration, water (75 g) and dichloromethane (44 g) were added to the filtrate for extraction of a target substance into the dichloromethane layer. The organic layer was repeatedly washed with distilled water until the pH of the separated aqueous layer became 7. The solvent was removed by means of a rotary evaporator, and the thus-obtained oily substance was dissolved in acetonitrile (20 g). The acetonitrile layer was washed five times with hexane (15 g). The solvent was removed by means of a rotary evaporator, to thereby yield 4.64 g of a brown oily substance. Through ¹H-NMR analysis and ion chromatography, this substance was identified to be 4-vinyloxyethoxyphenyldi(4-t-butylphenyl)sulfonium 2,4,6-triisopropylbenzenesulfonate.

$^1$H-NMR (400 MHz, CDCl$_3$) δ1.21 (d,J=6.8 Hz,18H), 1.32 (s,18H), 2.83 (sep,J=6.8 Hz,1H), 4.02-4.08(m,3H), 4.24 (dd, J=14.3,2.4 Hz,1H), 4.29-4.31 (m,2H), 4.73 (sep,J=6.8 Hz,2H), 6.50 (dd,J=14.4,6.8 Hz,1H), 7.02 (s,2H), 7.24-7.26 (m,2H), 7.60-7.89 (m,10H)

Synthesis Example 7

Synthesis of 4-vinyloxyethoxyphenyldiphenylsulfonium 2,4,6-triisopropylbenzenesulfonate

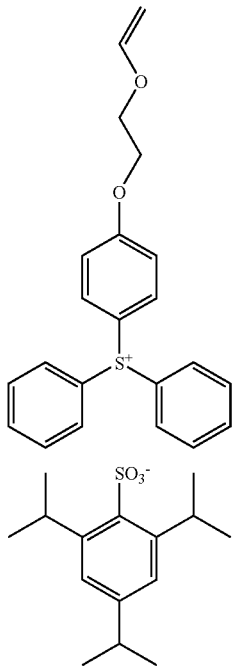

4-Hydroxyphenyldiphenylsulfonium 2,4,6-triisopropylbenzenesulfonate (8.00 g), potassium carbonate (2.46 g), and N,N,N',N'-tetramethylethylenediamine (0.16 g) were dissolved in dimethyl sulfoxide (24.00 g). Subsequently, chloroethyl vinyl ether (1.59 g) was added to the resultant solution, followed by heating to 80° C. and stirring for 15 hours. The resultant reaction mixture was cooled to 30° C. or lower. After removal of solid matter through filtration, water (160 g) and dichloromethane (64 g) were added to the filtrate for extraction of a target substance into the dichloromethane layer. The organic layer was repeatedly washed with distilled water until the pH of the separated aqueous layer became 7. The solvent was removed by means of a rotary evaporator, and the thus-obtained oily substance was dissolved in acetonitrile (32 g). The acetonitrile layer was washed five times with hexane (24 g). The solvent was removed by means of a rotary evaporator, to thereby yield 9.84 g of a brown oily substance. Through $^1$H-NMR analysis and ion chromatography, this substance was identified to be 4-vinyloxyethoxyphenyldiphenylsulfonium 2,4,6-triisopropylbenzenesulfonate.

$^1$H-NMR (400 MHz, CDCl$_3$) δ1.21 (d,18H), 2.83 (sep, 1H), 4.02-4.08(m,3H), 4.24 (dd,1H), 4.29-4.31 (m,2H), 4.73 (sep,2H), 6.50 (dd,1H), 7.02 (s,2H), 7.24-7.26 (m,2H) 7.60-7.89z (m,12H)

Synthesis Example 8

Synthesis of 4--vinyloxyethoxyphenyldiphenylsulfonium 2-trifluoromethylbenzenesulfonate

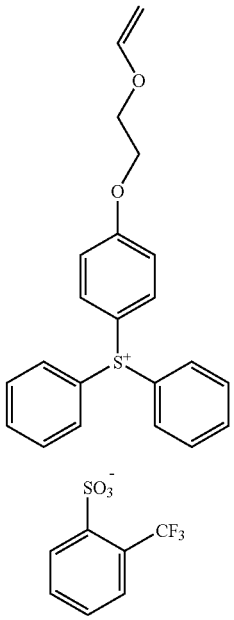

Diphosphorus pentoxide (3.00 g) and diphenyl sulfoxide (8.01 g) were dissolved in methanesulfonic acid (38.11 g), and then phenol (5.75 g) was added to the resultant solution, followed by stirring at room temperature for 15 hours. While the resultant mixture was maintained at 30° C. or lower, water (120 g) was added dropwise to the mixture. The thus-obtained aqueous layer was washed thrice with t-butyl methyl ether (40 g), and then dichloromethane (80 g) and potassium 2-trifluoromethylbenzenesulfonate (11.79 g) were added to the washed aqueous layer, followed by stirring for two hours. After termination of stirring, the thus-separated aqueous layer was removed, and then 0.1 wt. % aqueous ammonia solution (28 g) was added to the organic layer, followed by stirring. After termination of stirring, the thus-separated aqueous layer was removed. The aforementioned procedure was repeated until the pH of the separated aqueous layer became 7. The solvent was removed by means of a rotary evaporator, to thereby yield 10.33 g of 4-hydroxyphenyldiphenylsulfonium 2-trifluoromethylbenzenesulfonate as a white powdery substance.

4-Hydroxyphenyldiphenylsulfonium 2-trifluoromethylbenzenesulfonate (8.01 g), potassium carbonate (2.74 g), and N,N,N',N'-tetramethylethylenediamine (0.18 g) were dissolved in dimethyl sulfoxide (36 g). Subsequently, chloroethyl vinyl ether (5.31 g) was added to the resultant solution, followed by heating to 80° C. and stirring for 15 hours. The resultant reaction mixture was cooled to 30° C. or lower. After removal of solid matter through filtration, water (40 g) was added to the filtrate, and the aqueous layer was washed thrice with hexane (30 g). Dichloromethane (30 g) and water (60 g) were added to the washed aqueous layer, followed by stirring for extraction of a target substance into the dichloromethane layer. The organic layer was repeatedly washed with distilled water until the pH of the separated aqueous layer became 7. The solvent was removed by means of a rotary evaporator, to thereby yield 3.7 g of an oily substance. Through $^1$H-NMR analysis and ion chromatography, this substance was identified to be 4-vinyloxyethoxyphenyldiphenylsulfonium 2-trifluoromethylbenzenesulfonate.

$^1$H-NMR (400 MHz, CDCl$_3$) δ4.09-4.05 (m,2H), 4.23 (d,1H), 4.27 (d,1H), 4.36 (t,2H), 6.53 (q,1H), 7.28 (d,2H), 7.41 (t,1H), 7.50 (t,1H), 7.69-7.64 (m,10H), 7.85 (d,2H), 8.41 (d,2H)

Synthesis Example 9

Synthesis of 4-vinyloxyethoxyphenyldi(4-t-butylphenyl)sulfonium 2-trifluoromethylbenzenesulfonate

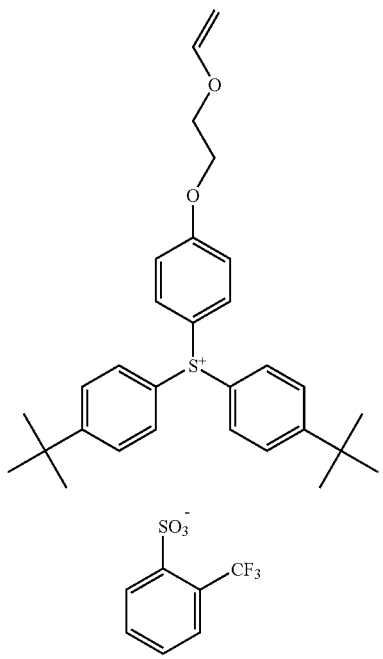

4-Hydroxyphenyldi(4-t-butylphenyl)sulfonium 2-trifluoromethylbenzenesulfonate (4.51 g), potassium carbonate (5.30 g), and N,N,N',N'-tetramethylethylenediamine (0.53 g) were dissolved in dimethyl sulfoxide (30 g). Subsequently, chloroethyl vinyl ether (10.03 g) was added to the resultant solution, followed by heating to 80° C. and stirring for 15 hours. The resultant reaction mixture was cooled to 30° C. or lower. After removal of solid matter through filtration, water (150 g) and dichloromethane (93 g) were added to the filtrate for extraction of a target substance into the dichloromethane layer. The organic layer was repeatedly washed with distilled water until the pH of the separated aqueous layer became 7. The solvent was removed by means of a rotary evaporator, to thereby yield 8.57 g of a red powdery substance. Through $^1$H-NMR analysis and ion chromatography, this substance was identified to be 4-vinyloxyethoxyphenyldi(4-t-butylphenyl)sulfonium 2-trifluoromethylbenzenesulfonate.

$^1$H-NMR (400 MHz, CDCl$_3$) δ1.32 (s,18H), 4.09-4.05 (m,2H), 4.23 (d,1H), 4.27 (d,1H), 4.36 (t,2H), 6.53 (q,1H), 7.28 (d,2H), 7.41 (t,1H), 7.50 (t,1H), 7.69-7.64 (m,8H), 7.85 (d,2H), 8.41 (d,2H)

Example 1

Synthesis of Photosensitive Resin 1 Represented by the Following Formula (A) (Photosensitive Resin of Type 1 Shown in Table 1)

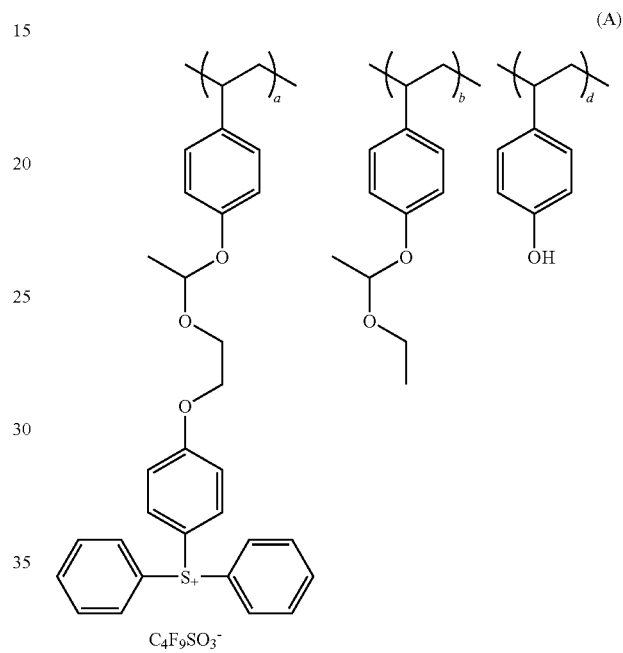

Polyhydroxystyrene (molecular weight (Mw): 16,400, as reduced to polystyrene, and molecular weight distribution (Mw/Mn): 1.09) (50.0 g) was dissolved in 1,3-dioxolan (350 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (62 μL) was added thereto. Subsequently, 34.6 wt. % 1,3-dioxolan solution (28.4 g) of ethyl vinyl ether was added dropwise to the reaction mixture over one hour, followed by stirring at 30° C. for two hours. The resultant reaction mixture was cooled to 15° C., and 63.8 wt. % 1,3-dioxolan solution (8.8 g) of 4-vinyloxyethoxyphenyldiphenylsulfonium perfluorobutanesulfonate produced in Synthesis Example 1 was added dropwise thereto over 30 minutes, followed by stirring at 30° C. for two hours. The resultant reaction mixture was neutralized with aqueous ammonia, and the mixture was added dropwise to pure water (1,700 g) of room temperature, to thereby precipitate solid matter. The solid matter was recovered through filtration, and then was reprecipitated with acetonitrile and pure water, followed by drying at 35° C. for 24 hours, to thereby yield 53.5 g of a resin. Through $^1$H-NMR analysis, this resin was determined to be a photosensitive resin having a structure which includes a repeating unit represented by formula (1) in an amount of 1.6%, and in which percent ethoxyethylation of hydroxyl groups in the employed polyhydroxystyrene is 30.6%; i.e., compositional proportions (mol %) of a, b, and d are 1.6, 30.6, and 67.8, respectively.

Example 2

Synthesis of Photosensitive Resin 2 Represented by Formula (A) (Photosensitive Resin of Type 1 Shown in Table 1)

Polyhydroxystyrene (molecular weight (Mw): 16,400, as reduced to polystyrene, and molecular weight distribution (Mw/Mn): 1.09) (50.0 g) was dissolved in 1,3-dioxolan (350 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (62 μL) was added thereto. Subsequently, 35.4 wt. % 1,3-dioxolan solution (27.9 g) of ethyl vinyl ether was added dropwise to the reaction mixture over one hour, followed by stirring at 30° C. for two hours. The resultant reaction mixture was cooled to 15° C., and 63.8 wt. % 1,3-dioxolan solution (2.8 g) of 4-vinyloxy-ethoxyphenyldiphenylsulfonium perfluorobutanesulfonate produced in Synthesis Example 1 was added dropwise thereto over 30 minutes, followed by stirring at 30° C. for two hours. The resultant reaction mixture was neutralized with aqueous ammonia, and the mixture was added dropwise to pure water (2,000 g) of room temperature, to thereby precipitate solid matter. The solid matter was recovered through filtration, and then was reprecipitated with acetonitrile and pure water, followed by drying at 35° C. for 24 hours, to thereby yield 52.0 g of a resin. Through $^1$H-NMR analysis, this resin was determined to be a photosensitive resin having a structure which includes a repeating unit represented by formula (1) in an amount of 0.60%, and in which percent ethoxyethylation of hydroxyl groups in the employed polyhydroxystyrene is 30.80; i.e., compositional proportions (mol %) of a, b, and d are 0.6, 30.8, and 68.6, respectively.

Example 3

Synthesis of Photosensitive Resin 3 Represented by the Following Formula (B) (Photosensitive Resin of Type 3 Shown in Table 1)

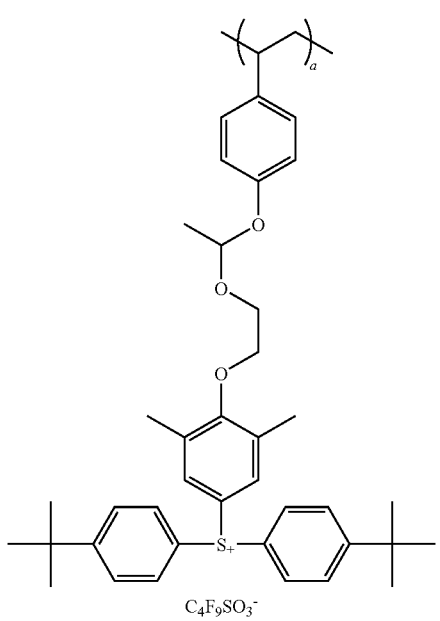

(B)

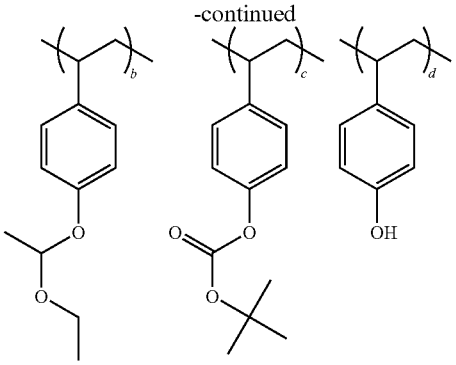

-continued

Polyhydroxystyrene (molecular weight (Mw): 16,400, as reduced to polystyrene, and molecular weight distribution (Mw/Mn): 1.09) (50.0 g) was dissolved in 1,3-dioxolan (350 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (63 μL) was added thereto. Subsequently, 28.1 wt. % 1,3-dioxolan solution (26.0 g) of ethyl vinyl ether was added dropwise to the reaction mixture over one hour, followed by stirring at 30° C. for two hours. The resultant reaction mixture was cooled to 15° C., and 63.8 wt. % 1,3-dioxolan solution (8.8 g) of 4-vinyloxy-ethoxy-3,5-dimethylphenyldi(4-t-butylphenyl)sulfonium perfluorobutanesulfonate produced in Synthesis Example 2 was added dropwise thereto over 30 minutes, followed by stirring at 30° C. for two hours. Thereafter, N,N-dimethylaminopyridine (0.21 g) was added to the reaction mixture, followed by heating to 40° C. 70.0 Wt. % 1,3-dioxolan solution (19.5 g) of di-tert-butyl dicarbonate was added dropwise to the reaction mixture over one hour, followed by stirring for one hour at the temperature at the time when dropwise addition was completed. The resultant reaction mixture was added dropwise to pure water (1,700 g) of room temperature, to thereby precipitate solid matter. The solid matter was recovered through filtration, and then was reprecipitated with dichloromethane and hexane, followed by drying at 35° C. for 24 hours, to thereby yield 53.1 g of a resin. Through $^1$H-NMR analysis, this resin was determined to be a photosensitive resin having a structure which includes a repeating unit represented by formula (1) in an amount of 1.7%, and in which percent ethoxyethylation of hydroxyl groups in the employed polyhydroxystyrene is 21.4%, and percent t-butoxycarbonylation of hydroxyl groups in the polyhydroxystyrene is 9.2%;

i.e., compositional proportions (mol %) of a, b, c, and. d are 1.7, 21.4, 9.2, and 67.7, respectively.

Example 4

Synthesis of Photosensitive Resin 4 Represented by the Following Formula (C) (Photosensitive Resin of Type 1 Shown in Table 1)

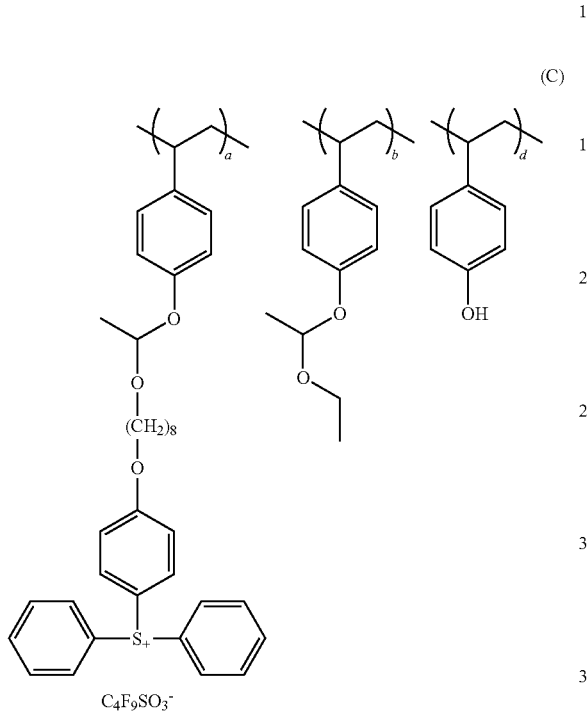

Polyhydroxystyrene (molecular weight (Mw): 16,400, as reduced to polystyrene, and molecular weight distribution (Mw/Mn): 1.09) (50.0 g) was dissolved in 1,3-dioxolan (350 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (62 μL) was added thereto. Subsequently, 35.4 wt. % 1,3-dioxolan solution (27.9 g) of ethyl vinyl ether was added dropwise to the reaction mixture over one hour, followed by stirring at 30° C. for two hours. The resultant reaction mixture was cooled to 15° C., and 63.8 wt. % 1,3-dioxolan solution (4.2 g) of 4-vinyloxy-octoxyphenyldiphenylsulfonium perfluorobutanesulfonate produced in Synthesis Example 3 was added dropwise thereto over 30 minutes, followed by stirring at 30° C. for two hours. The resultant reaction mixture was neutralized with aqueous ammonia, and the mixture was added dropwise to pure water (2,000 g) of room temperature, to thereby precipitate solid matter. The solid matter was recovered through filtration, and then was reprecipitated with acetonitrile and pure water, followed by drying at 35° C. for 24 hours, to thereby yield 52.0 g of a resin. Through $^1$H-NMR analysis, this resin was determined to be a photosensitive resin having a structure which includes a repeating unit represented by formula (1) in an amount of 1.0%, and in which percent ethoxyethylation of hydroxyl groups in the employed polyhydroxystyrene is 30.2%; i.e., compositional proportions (mol %) of a, b, and d are 1.0, 30.2, and 68.8, respectively.

Example 5

Synthesis of Photosensitive Resin 5 Represented by the Following Formula (D) (Photosensitive Resin of Type 1 Shown in Table 1)

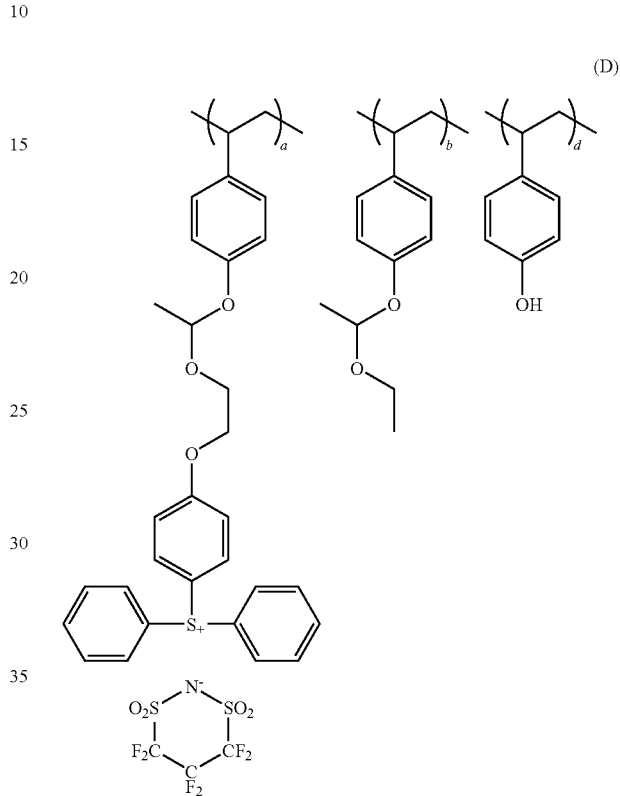

Polyhydroxystyrene (molecular weight (Mw): 9,000, as reduced to polystyrene, and molecular weight distribution (Mw/Mn): 1.11) (50.0 g) was dissolved in 1,3-dioxolan (400 mL) in a nitrogen atmosphere, and the water content of the reaction system was found to be reduced to 100 ppm or less. The solution was cooled to 15° C., and 35 wt. % hydrochloric acid (63 μL) was added thereto. Subsequently, 35.5 wt. % 1,3-dioxolan solution (28.4 g) of ethyl vinyl ether was added dropwise to the reaction mixture over 15 minutes, followed by stirring at 15° C. for 60 minutes and at 30° C. for 1.5 hours. The resultant reaction mixture was cooled to 15° C., and 35.1 wt. % 1,3-dioxolan solution (8.4 g) of 4-vinyloxyethoxyphe-nyldiphenylsulfonium cyclo(1,3-perfluoropropanedisulfon) imide produced in Synthesis Example 4 was added dropwise thereto over 15 minutes, followed by stirring at 15° C. for 30 minutes and at 30° C. for two hours. The resultant reaction mixture was neutralized through addition of 28 wt. % aqueous ammonia (172 μL) and stirring for 10 minutes or more, and the mixture was added dropwise to pure water (1,700 g) of room temperature over one hour, to thereby precipitate solid matter. The solid matter was recovered through filtration, and then was reprecipitated with acetonitrile and pure water, followed by drying at 35° C. for 24 hours, to thereby yield 53.7 g of a resin. Through $^1$H-NMR analysis, this resin was determined to be a photosensitive resin having a structure which includes a repeating unit represented by formula (1) in an amount of 1.1%, and in which percent ethoxyethylation of hydroxyl groups in the employed polyhydroxystyrene is 31.8%; i.e., compositional proportions (mol %) of a, b, and d are 1.1, 31.8, and 67.1, respectively.

Example 6

Synthesis of Photosensitive Resin 6 Represented by the Following Formula (E) (Photosensitive Resin of Type 1 Shown in Table 1)

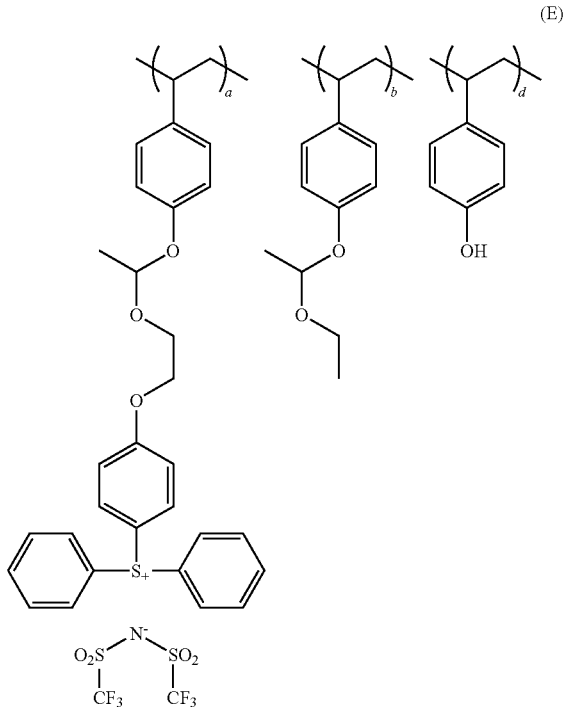

(E)

Polyhydroxystyrene (molecular weight (Mw): 16,400, as reduced to polystyrene, and molecular weight distribution (Mw/Mn): 1.09) (50.0 g) was dissolved in 1,3-dioxolan (350 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (62 μL) was added thereto. Subsequently, 35.4 wt. % 1,3-dioxolan solution (27.9 g) of ethyl vinyl ether was added dropwise to the reaction mixture over one hour, followed by stirring at 30° C. for two hours. The resultant reaction mixture was cooled to 15° C., and 63.8 wt. % 1,3-dioxolan solution (3.4 g) of 4-vinyloxy-ethoxyphenyldiphenylsulfonium bis(perfluoromethane-sulfon)imide produced in Synthesis Example 5 was added dropwise thereto over 30 minutes, followed by stirring at 30° C. for two hours. The resultant reaction mixture was neutralized with aqueous ammonia, and the mixture was added dropwise to pure water (2,000 g) of room temperature, to thereby precipitate solid matter. The solid matter was recovered through filtration, and then was reprecipitated with acetonitrile and pure water, followed by drying at 35° C. for 24 hours, to thereby yield 52.0 g of a resin. Through $^1$H-NMR analysis, this resin was determined to be a photosensitive resin having a structure which includes a repeating unit represented by formula (1) in an amount of 0.8%, and in which percent ethoxyethylation of hydroxyl groups in the employed poly-hydroxystyrene is 30.8%; i.e., compositional proportions (mol %) of a, b, and d are 0.8, 30.8, and 68.4, respectively.

Example 7

Synthesis of Photosensitive Resin 7 Represented by the Following Formula (F) (Photosensitive Resin of Type 1 Shown in Table 1)

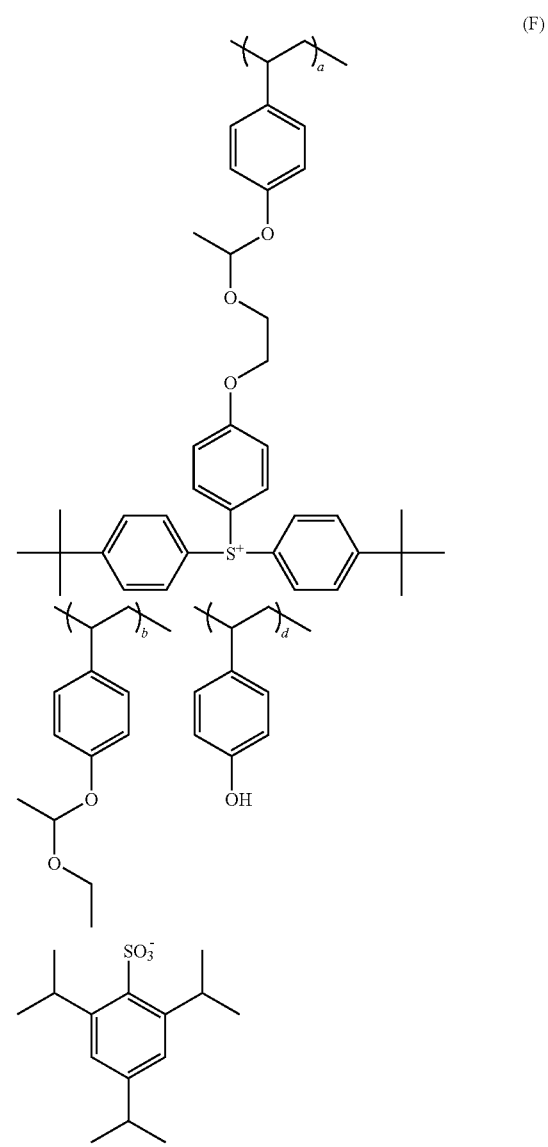

(F)

Polyhydroxystyrene (molecular weight (Mw): 16,400, as reduced to polystyrene, and molecular weight distribution (Mw/Mn): 1.09) (50.0 g) was dissolved in 1,3-dioxolan (350 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (62 μL) was added thereto. Subsequently, 31.3 wt. % 1,3-dioxolan solution (27.2 g) of ethyl vinyl ether was added dropwise to the reaction mixture over one hour, followed by stirring at 30° C. for two hours. The resultant reaction mixture was cooled to 15° C., and 19.9 wt. % 1,3-dioxolan solution (10.1 g) of 4-vinyloxyethoxyphenyldi(4-t-butylphenyl)sulfonium 2,4,6-triisopropylbenzenesulfonate produced in Synthesis Example 6 was added dropwise thereto over 30 minutes, followed by stirring at 30° C. for two hours. The resultant reaction mixture was neutralized with aqueous ammonia, and the mixture was added dropwise to pure water (2,500 g) of room temperature, to thereby precipitate solid matter. The solid matter was recovered through filtration, and then was reprecipitated with acetonitrile and pure water, followed by drying at 35° C. for 24 hours, to thereby yield 53.7 g of a resin. Through $^1$H-NMR analysis, this resin was determined to be a photosensitive resin having a structure which includes a repeating unit represented by formula (1) in an amount of 0.6%, and in which percent ethoxyethylation of hydroxyl groups in the employed polyhydroxystyrene is 32.3%; i.e., compositional proportions (mol %) of a, b, and d are 0.6, 32.3, and 67.1, respectively.

Example 8

Synthesis of Photosensitive Resin 8 Represented by the Following Formula (G)

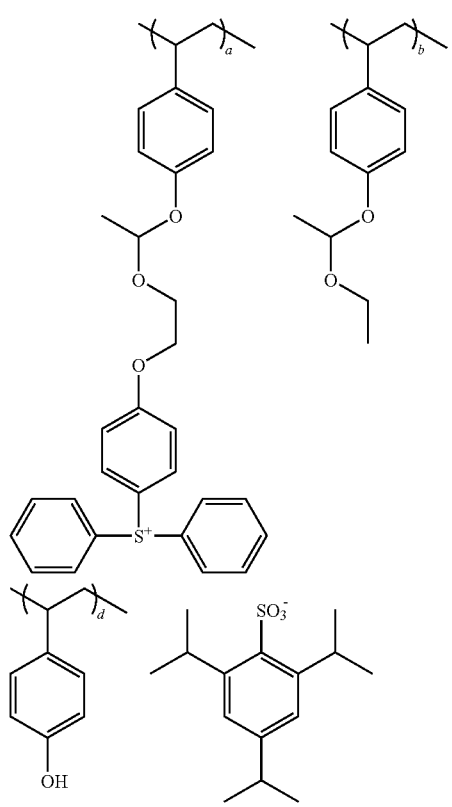

Polyhydroxystyrene (molecular weight (Mw): 16,400, as reduced to polystyrene, and molecular weight distribution (Mw/Mn): 1.09) (20.00 g) was dissolved in 1,3-dioxolan (200 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (25 μL) was added thereto. Subsequently, 37.2 wt. % 1,3-dioxolan solution (11.89 g) of ethyl vinyl ether was added dropwise to the reaction mixture over one hour, followed by stirring at 30° C. for two hours. The resultant reaction mixture was cooled to 15° C., and 63.8 wt. % 1,3-dioxolan solution (1.46 g) of 4-vinyloxyethoxyphenyldiphenylsulfonium 2,4,6-triisopropylbenzenesulfonate produced in Synthesis Example 7 was added dropwise thereto over 30 minutes, followed by stirring at 30° C. for two hours. The resultant reaction mixture was neutralized with aqueous ammonia, and the mixture was added dropwise to pure water (1,000 g) of room temperature, to thereby precipitate solid matter. The solid matter was recovered through filtration, and then was reprecipitated with acetonitrile and pure water, followed by drying at 35° C. for 24 hours, to thereby yield 18.32 g of a resin. Through $^1$H-NMR analysis, this resin was determined to be a photosensitive resin having a structure which includes a repeating unit represented by formula (1) in an amount of 0.6%, and in which percent ethoxyethylation of hydroxyl groups in the employed polyhydroxystyrene is 33.0%; i.e., compositional proportions (mol %) of a, b, and d are 0.6, 33.0, and 66.4, respectively.

Example 9

Synthesis of photosensitive resin 9 represented by the following formula (H)

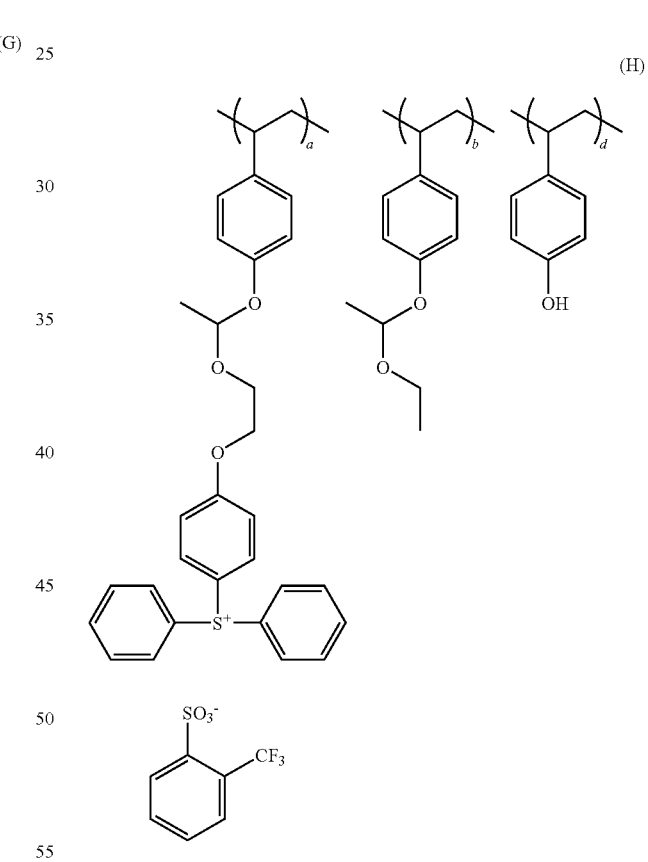

Polyhydroxystyrene (molecular weight (Mw): 16,400, as reduced to polystyrene, and molecular weight distribution (Mw/Mn): 1.09) (20.0 g) was dissolved in 1,3-dioxolan (200 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (25 μL) was added thereto. Subsequently, 37.8 wt. % 1,3-dioxolan solution. (12.02 g) of ethyl vinyl ether was added dropwise to the reaction mixture over one hour, followed by stirring at 30° C. for two hours. The resultant reaction mixture was cooled to 15° C., and 66.0 wt. % 1,3-dioxolan solution (1.45 g) of 4-vinyloxyethoxyphenyldiphenylsulfonium 2-trifluoromethylbenzenesulfonate produced in Synthesis Example 8 was added dropwise thereto over 30 minutes, followed by stirring at 30° C. for two hours. The resultant reaction mixture was neutralized with aqueous ammonia, and the mixture was added dropwise to pure water (1,000 mL) of room temperature, to thereby precipitate solid matter. The solid matter was recovered through filtration, and then was reprecipitated with acetonitrile and pure water, followed by drying at 35° C. for 24 hours, to thereby yield a resin. Through $^1$H-NMR analysis, this resin was determined to be a photosensitive resin having a structure which includes a repeating unit represented by formula (1) in an amount of 1.4%, and in which percent ethoxyethylation of hydroxyl groups in the employed polyhydroxystyrene is 31.5%; i.e., compositional proportions (mol %) of a, b, and d are 1.4, 31.5, and 67.1, respectively.

Example 10

Synthesis of Photosensitive Resin 10 Represented by the Following Formula (I)

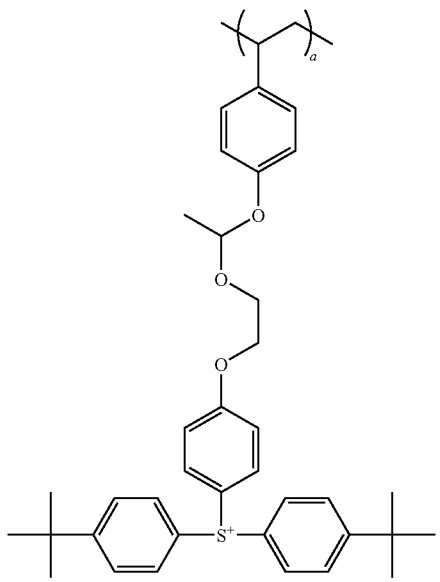

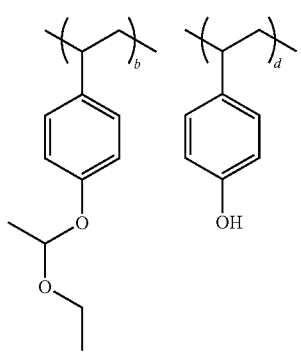

Polyhydroxystyrene (molecular weight (Mw): 16,400, as reduced to polystyrene, and molecular weight distribution (Mw/Mn): 1.09) (20.1 g) was dissolved in 1,3-dioxolan (200 mL) in a nitrogen atmosphere. Thereafter, 1,3-dioxolan was removed through evaporation at ambient pressure, and the water content of the reaction system was found to be reduced to 100 ppm or less. The reaction mixture was cooled to 20° C. or lower, and 35 wt. % hydrochloric acid (25 μL) was added thereto. Subsequently, 36.4 wt. % 1,3-dioxolan solution (11.84 g) of ethyl vinyl ether was added dropwise to the reaction mixture over one hour, followed by stirring at 30° C. for two hours. The resultant reaction mixture was cooled to 15° C., and 68.8 wt. % 1,3-dioxolan solution (1.46 g) of 4-vinyloxyethoxyphenyldi(4-t-butylphenyl)sulfonium 2-trifluoromethylbenzenesulfonate produced in Synthesis Example 9 was added dropwise thereto over 30 minutes, followed by stirring at 30° C. for two hours. The resultant reaction mixture was neutralized with aqueous ammonia, and the mixture was added dropwise to pure water (1,000 mL) of room temperature, to thereby precipitate solid matter. The solid matter was recovered through filtration, and then was reprecipitated with acetonitrile and pure water, followed by drying at 35° C. for 24 hours, to thereby yield a resin. Through $^1$H-NMR analysis, this resin was determined to be a photosensitive resin having a structure which includes a repeating unit represented by formula (1) in an amount of 0.6%, and in which percent ethoxyethylation of hydroxyl groups in the employed polyhydroxystyrene is 35.2%; i.e., compositional proportions (mol %) of a, b, and d are 0.6, 35.2, and 64.2, respectively.

<Evaluation Through Exposure to Light from Xenon Lamp>

(Preparation of Photoresist and Measurement of Breakthrough Time)

Photosensitive resin 1 produced in Example 1 (100 parts by weight) and triethanolamine (0.24 parts by weight) were dissolved in propylene glycol monomethyl acetate (525 parts by weight), and the resultant solution was filtered with a filter (PTFE filter), to thereby prepare a liquid positive photoresist (photosensitive composition). The resist was applied to a silicon wafer (diameter: 4 inches) by means of a spinner, and pre-baked at 110° C. for 90 seconds, to thereby form a resist film having a thickness of 500 nm. The resist film was exposed to light from a xenon lamp (wavelength: 248 nm), and post-baked (heated after light exposure) at 110° C. for 90 seconds. Thereafter, breakthrough time of the resist film was measured at 23° C. by use of a developer (2.38 wt. % aqueous tetramethylammonium hydroxide solution). As used herein, "breakthrough time" is a time (seconds) required for complete dissolution, through development, of the resist film after being irradiated with light of predetermined energy.

As a result, the breakthrough time of the resist film was found to be 12 seconds (at a light exposure dose of 100 mJ) or 3 seconds (at a light exposure dose of 500 mJ). These data indicate that when photosensitive resin 1 produced in Example 1 is exposed to light from a xenon lamp, an acid is generated from a structure represented by formula (1) (which structure is intrinsic to the photosensitive resin of the present invention), and an acid-dissociable group of the resin is dissociated by the thus-generated acid, whereby solubility of the resin in the developer is changed from "hardly soluble" to "soluble."

In a manner similar to the case of photosensitive resin 1 described above, a positive photoresist was prepared from each of photosensitive resins 2 to 10 produced in Examples 2 to 10, and a resist film formed from the photoresist was subjected to light exposure, post-baking, and developing, and breakthrough time of the resist film was measured. As a result, the breakthrough time of the thus-formed resist films was found to fall within a range of 12±2 seconds (at a light exposure dose of 100 mJ) or a range of 3±1 seconds (at a light exposure dose of 500 mJ). These data indicate that when each of photosensitive resins 2 to 10 is exposed to light from a xenon lamp, an acid is generated from a structure represented by formula (1) (which structure is intrinsic to the photosensitive resin of the present invention), and an acid-dissociable group of the resin (polymer) is dissociated by the thus-generated acid, whereby solubility of the resin in the developer is changed from "hardly soluble" to "soluble."

<Evaluation Through Exposure to Extreme UV Light (EUV)>

(Preparation and Application of Photoresist)

Photosensitive resin. 1 produced in Example 1 (100 parts by weight) and triphenylsilylamine (4 parts by weight) were dissolved in propylene glycol monomethyl ether acetate (2,000 parts by weight), and the resultant solution was filtered with a 0.2-μm filter (PTFE filter), to thereby prepare a positive photoresist. The resist solution was applied, through spin coating, onto a 4-inch silicon wafer treated with hexamethyldisilazane, followed by heating by means of a hot plate at 110° C. or thereabouts for 90 seconds or thereabouts, to thereby form a uniform film having a thickness of 0.1 μm. In a manner similar to the case of photosensitive resin 1, a positive photoresist was prepared from each of photosensitive resins 2 to 10 produced in Examples 2 to 10, and a film was formed from the photoresist.

(Measurement of Sensitivity)

There was employed, as exposure light, monochromatic extreme UV light (EUV) (wavelength: 13.5 nm) which had been obtained, through reflection by an Mo/Si multilayer, from synchrotron radiation generated at a bending electromagnet of NewSUBARU storage ring by use of incident accelerated electrons (1 GeV) from a linear accelerator in the large radiation facility SPring-8. Each of the above-formed photoresist thin films was irradiated with the EUV, and thermally treated at 90° C. or thereabouts for 60 seconds or thereabouts. Thereafter, the thus-treated film was immersed in 2.38 wt. % aqueous tetramethylammonium hydroxide (TMAH) solution at 23° C. for 30 seconds, followed by washing with water and drying. Subsequently, the thickness of the film was determined through a non-contact film thickness measuring method. The aforementioned procedure was performed at different levels of light exposure dose, and the light exposure dose at which the residual resist film thickness was zero was regarded as "Eth sensitivity."

Resist films formed from the photosensitive resins of Examples 1 to 10 were found to have an Eth sensitivity of 0.9 to 6 mJ/cm², indicating that the photosensitive resin of the present invention has very high sensitivity.

The amount of gas generated from a resist during light exposure was measured by means of a quadrupole mass analyzer. As a result, the amount of gas generated from a resist prepared from each of the photosensitive resins of Examples 1 to 10 was found to be small; specifically, about ½ to about ⅗ the amount of gas generated from a conventional ESCAP (chemically amplified resist), which generates a relatively small amount of gas. When the amount of gas generated is smaller, a mask, an optical system, etc. are less affected, which is preferred.

<Evaluation by Means of Electron Beam Lithography Apparatus>

(Preparation and Application of Photoresist)

Photosensitive resin 1 produced in Example 1 (100 parts by weight) and triphenylsilylamine (4 parts by weight) were dissolved in propylene glycol monomethyl ether acetate (2,000 parts by weight), and the resultant solution was filtered with a 0.2-μm filter (PTFE filter), to thereby prepare a positive photoresist. The resist solution was applied, through spin coating, onto a 4-inch silicon wafer treated with hexamethyldisilazane, followed by heating by means of a hot plate at 110° C. for 90 seconds, to thereby form a uniform film having a thickness of 0.1 μm. In a manner similar to the case of photosensitive resin 1, a positive photoresist was prepared from each of photosensitive resins 2 to 10 produced in Examples 2 to 10, and a film was formed from the photoresist.

By means of an electron beam lithography apparatus (acceleration voltage: 30 keV, electric current: 50 pA or thereabouts), each of the above-formed photoresist thin films was irradiated with an electron beam so that a 100-nm line-and-space pattern was formed. After irradiation with the electron beam, the resultant film was baked at 90° C. for 60 seconds, and immersed in 2.38 wt. % aqueous tetramethylammonium hydroxide (TMAH) solution at 23° C. for 30 seconds, followed by rinsing with pure water and drying. The thus-patterned film was evaluated through the following methods.

(Sensitivity)

A cross-section of the thus-patterned film was observed under a scanning electron microscope (SEM). The minimum irradiation energy required for attaining a resolution of 100-nm lines (line:space=1:1) was regarded as "sensitivity."

(Line Edge Roughness)

A line pattern formed at the aforementioned sensitivity was observed under an SEM, and line edge roughness (LER) was determined. Specifically, the line edge roughness was derived through calculating variations among the measurements at points (10-nm intervals) within a length of 1.5 μm along the line pattern and tripling the standard deviation. The smaller the line edge roughness, the higher the smoothness.

As a result, resists prepared from the photosensitive resins of Examples 1 to 10 were found to have a sensitivity of 6.4 to 20 μC/cm², and an LER of 2.0 nm to 6.0 nm; i.e., good patterns were formed. By means of an electron beam lithography apparatus (acceleration voltage: 50 kev), resists prepared from the photosensitive resins of Examples 1 to 10 were found to have a resolution of 100 nm or less. Particularly, a resist prepared from the photosensitive resin of Example 7 was found to have a resolution of 25 nm.

These data indicate that employment of the photosensitive resin of the present invention realizes formation of a good pattern.

The invention claimed is:

1. A photosensitive resin characterized by comprising a repeating unit represented by formula (1):

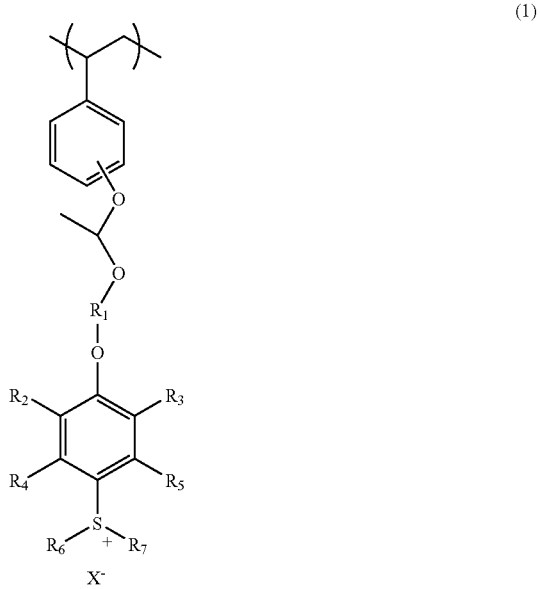

(wherein $R_1$ represents a C2-C9 linear or branched divalent hydrocarbon group; each of $R_2$ to $R_5$ represents a hydrogen atom or a C1-C3 linear or branched hydrocarbon group; each of $R_6$ and $R_7$ represents an organic group, wherein $R_6$ and $R_7$ may together form a divalent organic group; and $X^-$ represents an anion);

at least one of a repeating unit represented by formula (2):

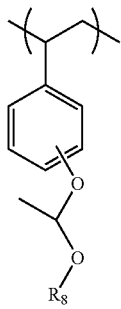
(2)

(wherein $R_8$ represents a C2-C9 linear or branched hydrocarbon group) and a repeating unit represented by formula (3):

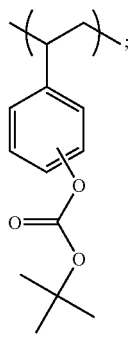
(3)

a repeating unit represented by formula (4):

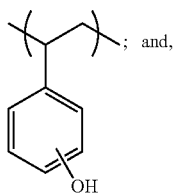
(4)

; and, optionally, a repeating unit represented by formula (5):

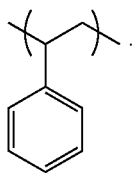
(5)

2. A photosensitive resin as described in claim 1, wherein the anion represented by $X^-$ is an anion represented by formula (6):

$$C_kH_mF_nSO_3^- \quad (6)$$

(wherein each of k, m, and n represents an integer of 0 or more, wherein when m is 0, k is an integer of 1 to 8, and n is 2k+1, the anion of formula (6) is a perfluoroalkylsulfonate ion; when n is 0, k is an integer of 1 to 15, and m is an integer of 1 or more, the anion of formula (6) is an alkylsulfonate ion, a benzenesulfonate ion, or an alkylbenzenesulfonate ion; or when each of m and n is an integer of 1 or more, and k is an integer of 1 to 10, the anion of formula (6) is a fluorine-substituted benzenesulfonate ion, a fluorine-substituted alkylbenzenesulfonate ion, or a fluorine-substituted alkylsulfonate ion.

3. A photosensitive resin as described in claim 1, wherein the anion represented by $X^-$ is a bis(perfluoroalkylsulfon) imide ion represented by formula (7):

$$(C_pF_{2p+1}SO_2)_2N^- \quad (7)$$

(wherein p represents an integer of 1 to 8).

4. A photosensitive resin as described in claim 1, wherein the anion represented by $X^-$ is an anion represented by formula (8):

(8)

5. A photosensitive resin as described in claim 1, wherein the photosensitive resin has a weight average molecular weight of 2,000 to 100,000, and numbers of repeating units a, b, c, d, and e satisfy the following relations: a/(a+b+c+d+e)= 0.001 to 0.3; (b+c)/(a+b+c+d+e)=0.1 to 0.5; (d+e)/(a+b+c+d+e)=0.5 to 0.8; and e/(d+e)=0 to 0.2, wherein a represents the number of repeating units of formula (1); b represents the number of repeating units of formula (2); c represents the number of repeating units of formula (3); d represents the number of repeating units of formula (4); and e represents the number of repeating units of formula (5).

6. A photosensitive resin as described in claim 1, which has a main chain having a terminal group which is a hydrogen atom or a methyl group.

7. A photosensitive composition characterized by being a solution of a photosensitive resin as recited in claim 1 dissolved in an organic solvent.

* * * * *